US007636904B2

(12) United States Patent
Song et al.

(10) Patent No.: US 7,636,904 B2
(45) Date of Patent: Dec. 22, 2009

(54) LOCATING CRITICAL DIMENSION(S) OF A LAYOUT FEATURE IN AN IC DESIGN BY MODELING SIMULATED INTENSITIES

(75) Inventors: Hua Song, San Jose, CA (US); Lantiang Wang, Fremont, CA (US); ZongWu Tang, Pleasanton, CA (US)

(73) Assignee: SYNOPSYS, Inc., Mountain View, CA (US)

( * ) Notice: Subject to any disclaimer, the term of this patent is extended or adjusted under 35 U.S.C. 154(b) by 361 days.

(21) Appl. No.: 11/584,356

(22) Filed: Oct. 20, 2006

(65) Prior Publication Data

US 2008/0109766 A1      May 8, 2008

(51) Int. Cl.
    *G06F 17/50*     (2006.01)
(52) U.S. Cl. .................... 716/5; 716/4; 716/20; 716/21
(58) Field of Classification Search .................... 716/4, 716/5, 19–21; 430/5, 311, 394
    See application file for complete search history.

(56) References Cited

U.S. PATENT DOCUMENTS

| | | | |
|---|---|---|---|
| 6,453,457 | B1 | 9/2002 | Pierrat et al. |
| 6,625,801 | B1 | 9/2003 | Pierrat et al. |
| 6,703,168 | B1 * | 3/2004 | Misaka ........................ 430/5 |
| 6,883,158 | B1 | 4/2005 | Sandstrom et al. |
| 7,010,775 | B2 | 3/2006 | Ohmori |
| 7,205,077 | B2 * | 4/2007 | Misaka ........................ 430/5 |
| 2004/0081899 | A1 * | 4/2004 | Misaka ........................ 430/5 |
| 2005/0177811 | A1 | 8/2005 | Kotani et al. |

OTHER PUBLICATIONS

Umatate, Toshikazu et al. "Controlling CD", Mar. 2005, SPIE's oemagazine, 15-17, pp. 3.
Zait, Eitan et al. "CD Control Inside the Bulk Photomasks", UCLT Ltd. Karmiel, Israel, Apr. 1, 2006, pp. 3.
Chapter 3, Section 3.1 "Polynomial Interpolation and Extrapolation" of the book "Numerical Recipes in C, The Art of Scientific Computing" by Press, W.H. et al, 1999, p. 108.
Chapter 3, Section 3.5 "Coefficients of the Interpolating Polynomial" of the book "Numerical Recipes in C, The Art of Scientific Computing" by Press, W.H. et al, 1999, p. 120.

(Continued)

*Primary Examiner*—Vuthe Siek
(74) *Attorney, Agent, or Firm*—Filicon Valley Patent Group LLP; Omkar Suryadevara

(57) ABSTRACT

A computer is programmed to perform lithography simulation at a number of locations in a transverse direction relative to a length of a feature of an IC design, to obtain simulated intensities at the locations. The computer is further programmed to determine constants of a predetermined formula that models a trend of the simulated intensities as a function of distance (in the transverse direction), by curve-fitting. The computer is also programmed to compute a value ("CD predictor") based on the just-determined constants, the formula and a known threshold intensity for a given position along the feature's length. The just-described process, of lithography-simulation, followed by curve-fitting, followed by CD predictor computation, is repeatedly performed to obtain a number of CD predictors at a corresponding number of positions along the feature's length. The CD predictors are used to identify a position of a critical dimension, for use in, for example, layout verification.

16 Claims, 9 Drawing Sheets

OTHER PUBLICATIONS

Press, W. H. et al. "Numerical Recipes in C, The Art of Scientific Computing", Second Edition, Cambridge University Press, 1999.

U.S. Appl. No. 11/142,789, filed on May 31, 2005 by ZongWu Tang et al.

Office Action dated Aug. 1, 2006 by Examiner Binh C. Tat in U.S. Appl. No. 11/142,789.

Amendment dated Oct. 25, 2006 in U.S. Appl. No. 11/142,789.

Notice of Allowance dated Jan. 11, 2007 in U.S. Appl. No. 11/142,789.

* cited by examiner

LOCATING CRITICAL DIMENSION(S) OF A LAYOUT FEATURE IN AN IC DESIGN BY MODELING SIMULATED INTENSITIES

BACKGROUND

1. Field of the Invention

The invention relates to verification of layouts used in fabrication of semiconductor wafers that contain integrated circuits (ICs). More specifically, the invention relates to a method and an apparatus for evaluation of criteria related to critical dimension (CD), such as conformity to user specification(s) of CD and/or uniformity of linewidth.

2. Related Art

In the manufacture of integrated circuit (IC) chips, minimum feature sizes have been shrinking according to Moore's law. Currently the minimum feature size is smaller than the wavelength of light used in the optical imaging system. Accordingly it has become increasingly difficult to achieve reasonable fidelity (including resolution and depth of focus) between (a) a layout as designed in a prior art computer in a place and route step 101 (FIG. 1A) and (b) shapes of circuit elements formed in a wafer fabrication step 106 (FIG. 1A). Step 106 normally involves a number of processes such as photolithography followed by metal deposition and chemical mechanical polishing. A result of place and route step 101 is a layout of rectangles shown in FIG. 1B. This illustrative layout has four traces (also called "lines") whose nominal contours (i.e. as designed in the computer) are shown by dashed rectangles 111n-114n. Also shown in FIG. 1B are closed contours 111i-114i which denote shapes of corresponding metal (or other material) as they would be formed if a wafer is fabricated using the layout.

In today's design flows, it is common to perform, after a tapeout step 104, a step 105 (called "mask synthesis") involving optical proximity correction and resolution enhancement, followed by a step 105a of physical verification. In step 105a, a simulation is performed of a lithographic process to be used to build the integrated circuits in a semiconductor wafer, and the simulation generates image intensities to which are applied one or more evaluation criteria such as measurement of critical dimension of contours (such as contours 111i-114i in FIG. 1B). Note that if step 105a finds errors, then the design flow may return to step 105 for additional RET or OPC based corrections but if such changes are insufficient to fix the errors, the flow may return to step 102 (as shown by the dashed arrow in FIG. 1A).

A human user of the prior art computer is typically interested in the minimum width of each trace (also called "critical dimension" and abbreviated as CD) for several reasons, e.g. when CD is too small an IC in the wafer may not perform as designed. In FIG. 1B, the minimum width 113wmin of trace 113 illustrates such a CD. The user may also be interested in uniformity of a trace's width along a longitudinal direction. In FIG. 1B, trace 113i has a maximum width 113wmax larger than nominal width 113w, which can cause a problem.

Determination of dimensions 113wmax and 113wmin can be performed as follows, using a method known to the inventors as follows. A nominal rectangle 113n that represents a to-be-formed trace in the IC is divided up into a number of rectangular portions, such as portions 120, 130 and 140 illustrated in FIG. 1C. Note that all portions of nominal rectangle 113n are not labeled in FIG. 1C, but these portions together appear like a track of a train (hence the method is also called a "gauge" method, and the portions are also called "gauge" portions).

Thereafter, the following process (called "bisection") is repeated for each gauge portion of nominal rectangle 113n. A prior art aerial image simulator is invoked to find (1) a first intensity (FIG. 1D) at nominal center 121 of a current gauge portion, (2) a second intensity a location 122 outside a nominal edge 125 of the current gauge portion, and (3) a third intensity at a midpoint 123 between the location 121 of the first intensity and the location 122 of the second intensity. Note that all the just-described locations 121, 122, 123 and 125 are located at an edge of a gauge portion (e.g. left vertical edge of gauge portion 120 in FIG. 1C) that is transverse to the feature (the feature's nominal polygon 113n is a rectangle that is shown horizontally oriented in FIG. 1C). Then, the third intensity is compared with a known threshold (which when applied to an intensity distribution of the lithographic process, results in a contour).

If the currently-computed third intensity is less than threshold, then its location 123 is used in a next iteration to invoke the aerial image simulator to re-compute the second intensity, followed by re-computing the third intensity again. If the currently-computed third intensity is greater than threshold, then its location 123 is used in the next iteration to invoke the aerial image simulator to re-compute the first intensity, followed by re-computing the third intensity (this time at location 124 in FIG. 1C). In this manner, a number of iterations are performed until a terminating criterion is met. The terminating criterion for the bisection process may be, for example, that the locations of the first and second intensities are sufficiently close to one another (e.g. locations 123 and 124 are sufficiently close) that they fall below a user-specified tolerance on CD location. When such a criterion is met, a linear interpolation between these two locations is used to find the position of contour 113i in the current gauge portion. After such contour positions are determined in every portion, the smallest width among all gauge portions forms the CD.

A prior art aerial image simulator that is used in such a method typically applies a number of mathematical formulations to layout shapes to simulate the lithography process, including not only optical effects (such as resolution and depth of focus) but also resist effects, etch effects etc. A combination of such effects in a semiconductor wafer fabrication process is used to create a layer in the wafer, for example, a metal layer or a polysilicon layer. A prior art aerial simulator may use a kernel-based model of the wafer fabrication process, by convolving an IC layout with convolution kernels to obtain the intensity at a location in a simulated wafer image.

One problem with the bisection process described above is that the aerial image simulator (used to simulate the lithography process) is invoked multiple times in each iteration. Accordingly, determining the location of edges of a single portion in the can easily require several invocations of the aerial image simulator (e.g. 10 invocations), and if there are several portions (e.g. 10 portions), then the total number of invocations per trace is quite large (e.g. 100 invocations total). Inventors find that when an aerial simulator is used so many times, the gauge method be easily scaled up for use in evaluating an IC layout in a reasonable amount of time (a few hours), given the current state of typically-used computing resources (e.g. a workstation containing a 2 GHz CPU and 1 GB memory).

U.S. patent application Ser. No. 11/142,789 entitled "CENTERLINE-BASED PINCH/BRIDGE DETECTION" filed on May 31, 2005 by ZongWu Tang, Juhwan Kim, Daniel Zhang, Haiqing Wei and Gang Huang is incorporated by reference herein in its entirety as background to the current invention. This patent application describes performing lithography simulation only along a centerline of a feature in an IC layout. The layout features whose centerlines are selected (for invoking an aerial image simulator) can either be layout elements, or spaces between layout elements. Certain embodiments simulate the lithographic process only along center lines of features selected for being likely to generate defects in lithography (e.g. a long and narrow layout element that is closely surrounded by other layout elements or a space between layout elements with long facing edges). However, the just-described centerline method can result in some errors under certain circumstances, e.g. (1) if intensity peak has drifted from nominal center of the trace (due to proximity effect of adjacent traces) or (2) if a corner is present adjacent at the end of the trace.

Accordingly, the inventors find there is a need for yet another method to evaluate criteria related to critical dimensions of an IC layout that is faster than the gauge method, and not prone to errors of the centerline method.

SUMMARY

A computer is programmed in accordance with the invention to perform lithography simulation at a few locations, in a transverse direction relative to a length of a feature of an IC design, to obtain simulated intensities (of performing lithography) at the locations. The precise number of locations (such as 2, 3, 4 or 5) at which the simulated intensities are computed, and where the locations are located relative to a nominal centerline of the feature, can be different depending on the specific embodiment.

The computer is further programmed to determine constants of a predetermined formula that models the simulated intensities as a function of distance (in the transverse direction), by curve-fitting. The precise formula that is used depends on the embodiment. Two such embodiments use a Gaussian formula and a quadratic formula, with three locations at which simulated intensities are computed. Another embodiment uses a piece wise linear formula with five locations at which simulated intensities are computed.

The computer is also programmed to compute a value (called predictor of critical dimension) based on the just-determined constants and the formula. An example of such a predictor is a distance within which the predetermined formula yields values greater than a predetermined threshold. Another example of such a predictor is one of the just-determined constants, or a predetermined combination of the just-determined constants.

The just-described process, of lithography-simulation, followed by curve-fitting, followed by predictor-computation, is repeatedly performed to obtain a number of predictors at a corresponding number of positions along a longitudinal direction of the feature. The predictors are used to automatically identify a position of occurrence of a critical dimension in the feature, which may be used in, for example, layout verification.

DETAILED DESCRIPTION

Figure 9A:
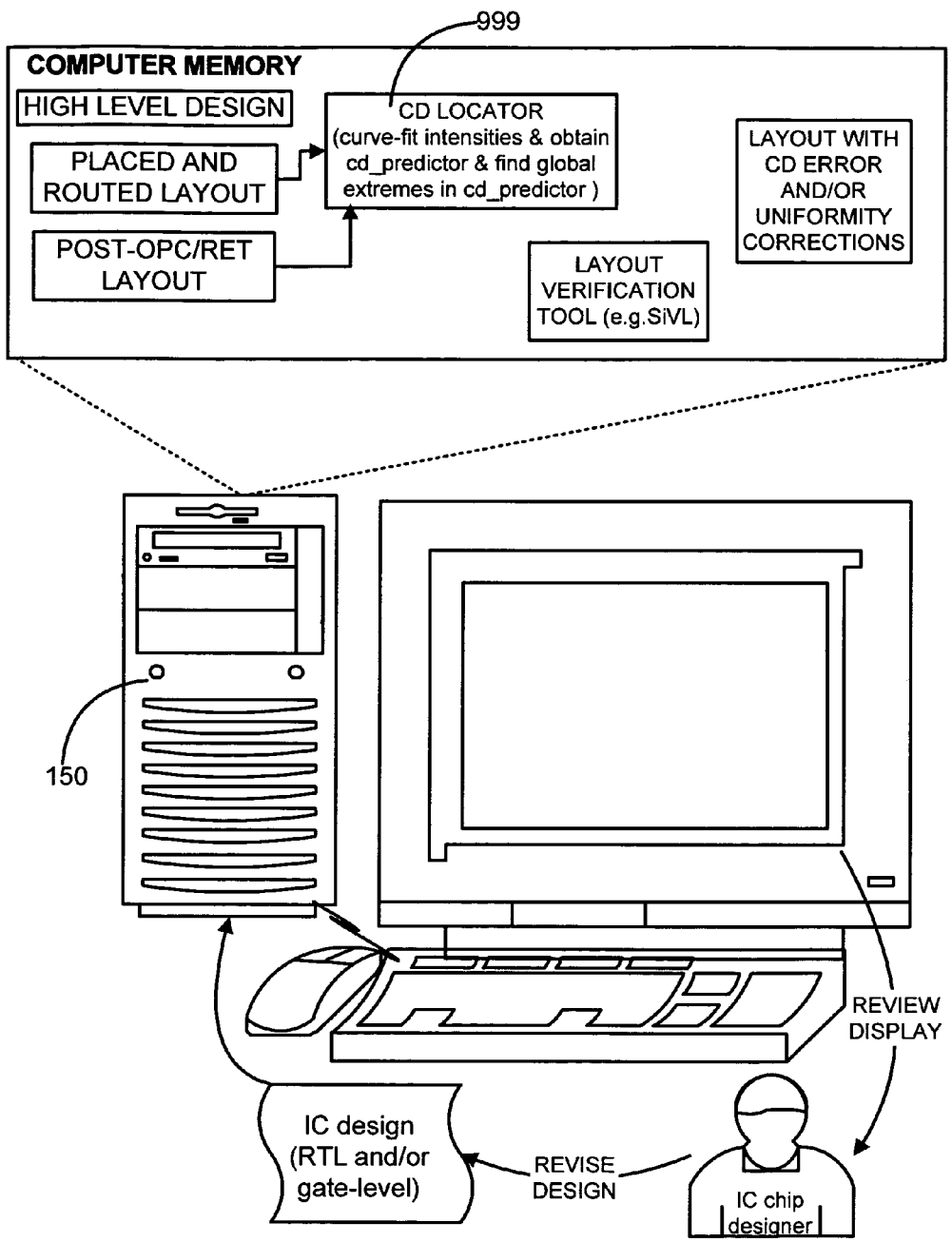
FIG. 9A illustrates, in a block diagram, a computer that is programmed in accordance with the invention.
Figure 9B:
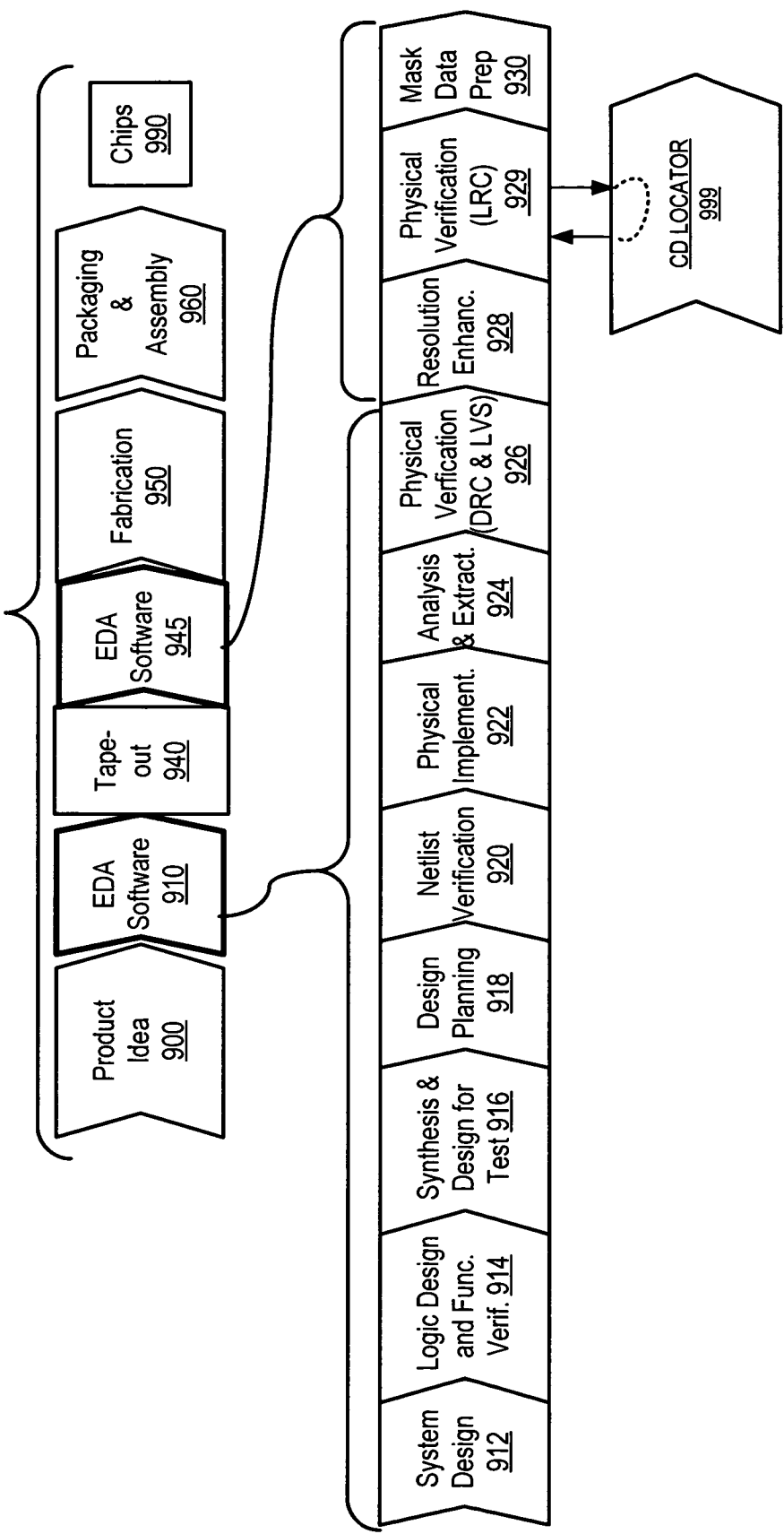
FIG. 9B illustrates, a simplified representation of an exemplary digital ASIC design flow in accordance with the invention.

A computer 150 (FIG. 9A) is programmed, in accordance with the invention, to perform acts 201-208 (FIG. 2) after performance of a place-and-route operation 102, and a layout verification operation 103 which involves geometry-based design rule checking (DRC) to obtain a first layout (called pre-RET/OPC layout), and after performance of a mask synthesis operation 105 to obtain a second layout (called post-RET/OPC layout). Software of instructions for computer 150 to perform acts 201-208 is also referred to below as a CD locator, and is shown in FIGS. 9A and 9B as item 999. The CD locator can be used as described below, to locate a position where a critical dimension of a feature occurs. Location of the critical dimension is useful for a number of reasons, including, for example, performance of act 209 to verify acceptability of an IC layout for fabrication.

Operation 102 is performed using any prior art place-and-route tool, such as the Astro product available from Synopsys, Inc.

In some embodiments of the invention, computer 150 is programmed to perform prior art layout verification operation 103 as follows. In act 201, the computer 150 receives an IC layout obtained from a place and route operation 102, as well as the post-RET/OPC layout. The pre-RET/OPC layout is used to identify nominal positions and dimensions of the layout features. For each layout feature which has been identified, computer 150 automatically divides up the feature into a number of transverse portions, i.e. identifies a number of positions, along a longitudinal direction of the feature, spanning a length of the feature. Next, computer 150 repeatedly performs a number of acts 203-207 in a loop as discussed below, for each position in the positions along the longitudinal direction of the feature that have just been identified, using the post-RET/OPC layout for lithography simulation.

In act 203, the computer selects one of the positions identified in act 202 to be the current position. Next, in act 204, the computer performs lithography simulation at several locations in a transverse direction relative to the longitudinal direction, to obtain a corresponding number of simulated intensities. In some embodiments, the lithography simulation is performed as few times as possible, to be able to perform act 205 (discussed next). Thereafter, in act 205, the computer automatically determines the constants of a predetermined formula that models the simulated intensities (which have been generated or which can be generated from lithography simulation), as a function of distance in the transverse direction at the current position.

Note that the locations at which intensities of performing lithography are simulated (as discussed in the previous paragraph) can be distributed either symmetrically or asymmetrically relative to the feature's position and shape, e.g. some embodiments use one location at a centerline of the feature and two locations at the two edges of the feature. Instead of two locations at the two edges, other embodiments use two locations that are 5% and 95% of width (relative to an edge of the feature) can be used in addition to a centerline location. Moreover, a specific number of intensities that are obtained by performing lithography simulation depends on the embodiment—some embodiments require 3 intensities (as noted above located at 0%, 50% and 100% of nominal width from an edge), while other embodiments require only 2 intensities (e.g. located at 25% and 75% of nominal width) whereas still other embodiments require 4 intensities (located at 15%, 30%, 70% and 85% of nominal width) or even 5 intensities (located at 0%, 25%, 50%, 75% and 100% of nominal width).

Note further that the simulated intensities do not need to be precisely modeled in such embodiments, and instead it is sufficient if a trend in such intensities (e.g. that the intensities are rising or falling) is indicated by such modeling. The formula that is used in act 205 is manually picked ahead of time, for its ability to quickly and efficiently generate values that are indicative of intensity trend as a function of distance in the transverse direction. Inventors find that approximate modeling that indicates a trend is sufficient for most embodiments to satisfy the objective of locating the critical dimension(s) along a longitudinal direction in a feature. For this reason, the formula is used in act 206, with a predetermined threshold value as a cutoff, to compute for the current position (along the longitudinal direction) a width at which the formula yields values greater than threshold, and the width is thereafter used as a predictor of critical dimension (also called CD predictor).

Note that any formula can be picked for use in acts 205 and 206, depending on the embodiment, as will be apparent to the skilled artisan in view of the disclosure. Examples of such a formula that are used in some embodiments are discussed below in reference to FIGS. 4 and 5. As noted above, it is not necessary to pick for use in act 206, a formula that precisely determines intensity values, and hence a formula is picked in many embodiments to avoid the significant amount of computation time and/or memory that are otherwise required (e.g. similar to use of lithography simulation). More specifically, the formula is picked in some embodiments for its quickness in generating values that provide a rough indication of trend in intensities, as a function of distance in a direction transverse to the length of the feature, e.g. in the X direction in FIG. 3B.

Next, in act 207, the computer checks if all identified positions in act 202 have been processed and if not, returns to act 203 to select another identified position for processing, to generate its CD predictor. Note that the cd_predictor values can, but do not have to, be approximations of the widths of the printed feature at the sampled locations. It is sufficient if the trend in such predictor values match that of the true widths of the feature. Examples of other values that can be used as a CD predictor are (a) a constant of the formula used in acts 205 and 206, and (b) a combination of two or more constants of the same formula.

When a CD predictor has been generated for all identified positions, the computer goes to act 208 and identifies the position(s) of critical dimension(s) in the longitudinal direction, using the CD predictors. For example, extreme values (such as maximum and minimum) of the CD predictors can be used to locate the maximum and minimum critical dimensions of the feature. Note that at this stage, the precise contour of the feature has not been determined by such embodiments. Instead, position of critical dimension(s) of the feature, relative to the feature's nominal position, is known at this stage (in these embodiments).

Figure 2:
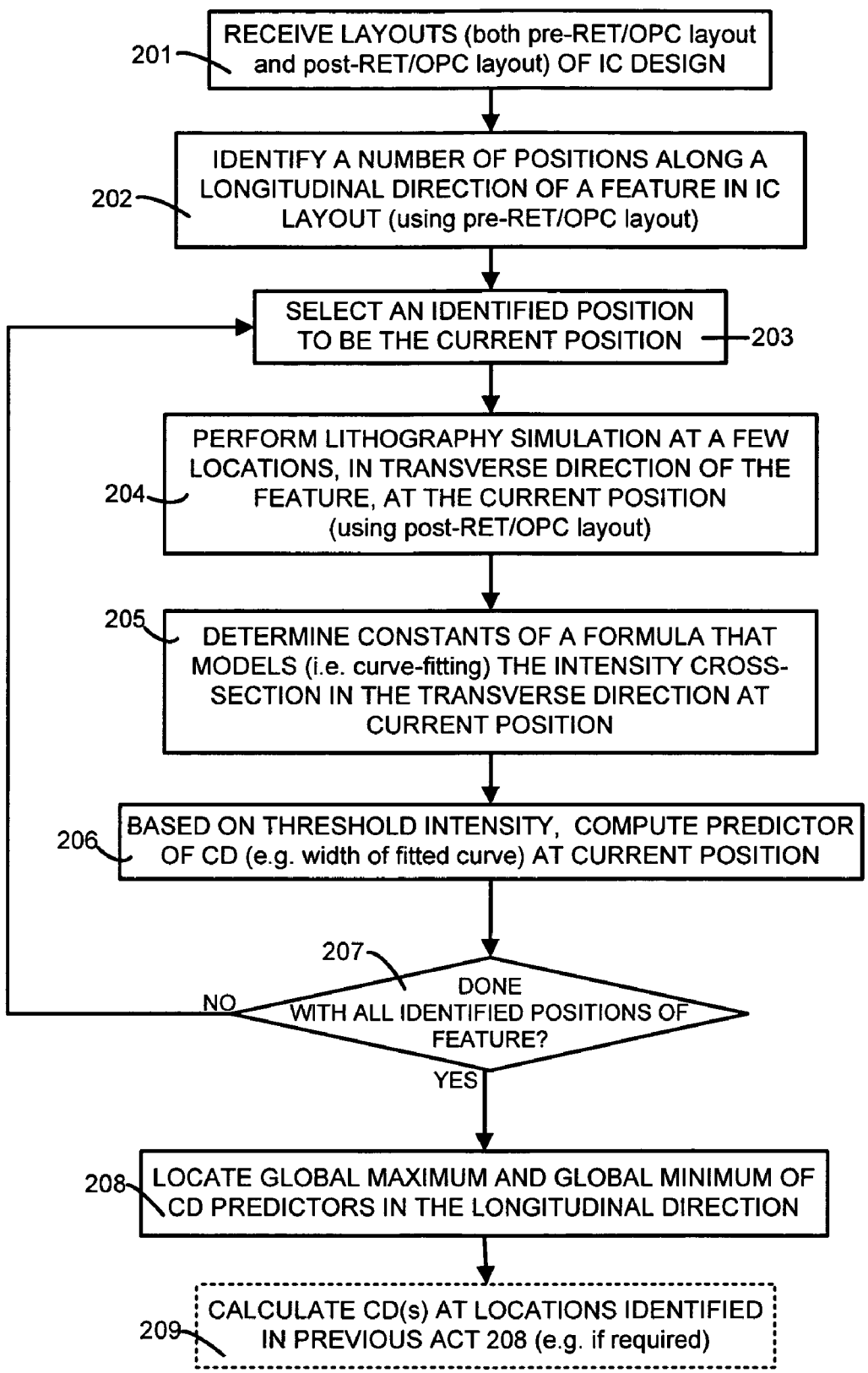
FIG. 2 illustrates, acts performed by a computer that has been programmed in accordance with the invention, to verify acceptability of an IC layout for fabrication.

Some computers are further programmed to use, as per act 209 in FIG. 2, the position of critical dimension(s) to verify acceptability of the layout. For example, several embodiments compute the maximum critical dimension and the minimum critical dimension which are then compared with a user-specified tolerance on the nominal width and nominal position of the feature. If the computed critical dimensions fall within the tolerance, then the layout is (in some embodiments) progressed to the next stage (assuming other such features are also all marked as being acceptable), such as tapeout, followed by mask synthesis, and wafer fabrication.

If, however, either of the two computed critical dimensions fall outside the tolerance, then the feature is automatically marked (by the programmed computer) as having unacceptable CD (or linewidth) uniformity, which requires further work on the layout. During such further work, a region of the IC layout containing the feature may be, for example, automatically ripped up followed by modified RET/OPC, or re-routing using different constraints (such as minimum spacing constraint) if the layout under verification if pre-RET/OPC. Alternatively, some embodiments display the region on a video monitor, and a human (IC chip designer) reviews the display and revises the IC design, either at the layout level using a layout editor or even at a high level by changing the size of the IC chip or its functionality. After such redesign, the method of FIG. 2 is again performed until the layout is found acceptable and progressed to the next stage, as described above.

Numerous embodiments of the method illustrated in FIG. 2 are encompassed by the invention. For example, some embodiments of the invention use maximum and minimum values of CD predictor for a given layout feature in the IC design, to identify two neighborhoods in the feature, and then perform further searching within the two neighborhoods to more precisely locate the corresponding maximum CD and the minimum CD therein, e.g. using the bisection process described in the background section. Other embodiments perform an additional curve fitting to determine constants of another predetermined formula (such as a quadratic) that models CD predictor values as a function of distance in the longitudinal direction of the feature.

Figure 1A:
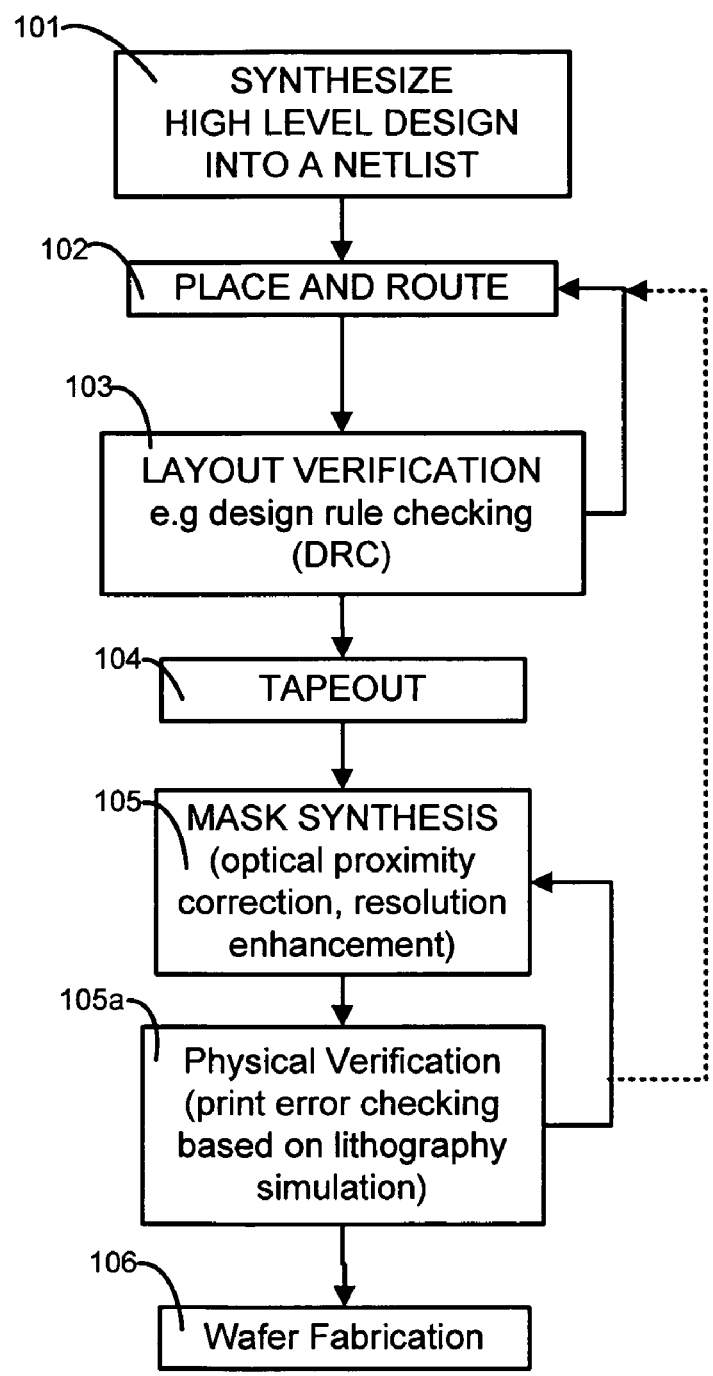
FIG. 1A shows a prior art data flow for conversion of an IC design specified in a high level hardware design language (HDL) into a mask for use in fabricating a semiconductor wafer.
Figure 1B:
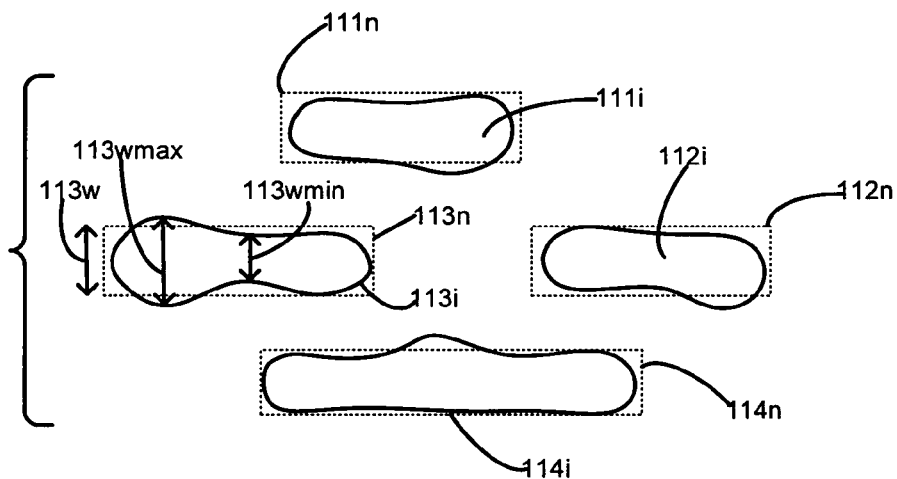
FIG. 1B shows a portion of a prior art layout used in the flow of FIG. 1A.
Figure 1C:
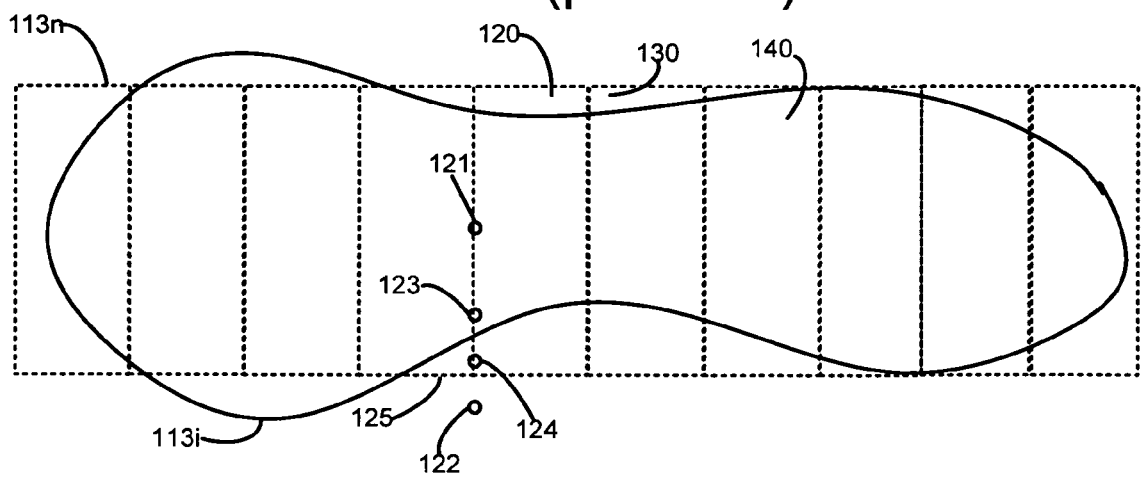
FIG. 1C shows an enlarged view of a rectangle 113n in the layout of FIG. 1B.
Figure 3A:
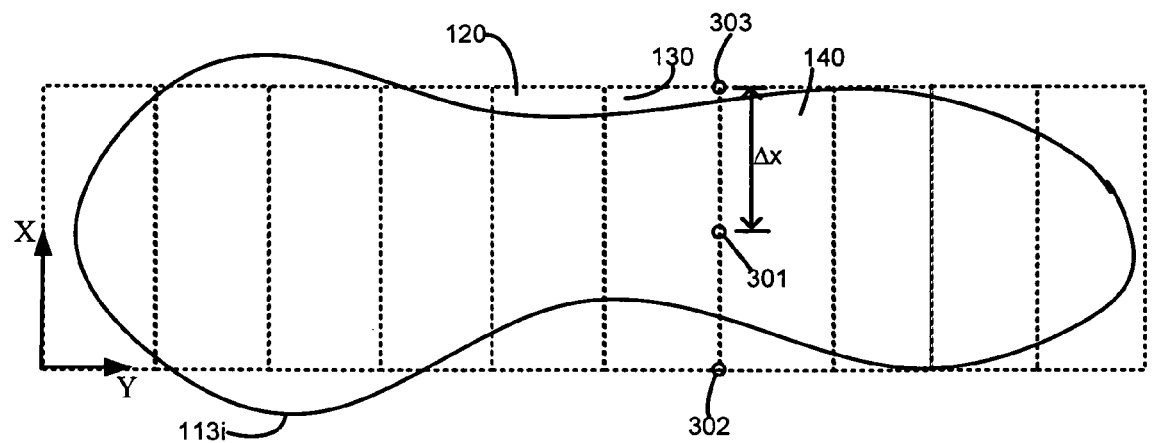
FIG. 3A illustrates three locations 301-303 on the rectangle 113n, identified by their locations at the center and edges of a gauge portion, at which lithographic simulation is performed in some embodiments.

Some embodiments divide up the nominal shape (such as a rectangle) of a feature into a number of portions (shown in FIG. 3A) that are similar to corresponding portions of the feature in the prior art (shown in FIG. 1C). However, in these embodiments, a bisection process is not used within each portion as described above. Instead, depending on the embodiment, a predetermined number of locations are selected within each portion, for performance of lithography simulation. In embodiments wherein lithography simulation is expensive in its use of computing resources, the number of such locations is minimized, e.g. limited to three locations. In one illustrative embodiment shown in FIG. 3A, the locations are selected to be at the center (location 301), and the two edges (locations 302 and 303) of each portion into which the nominal shape was divided up.

Figure 3B:
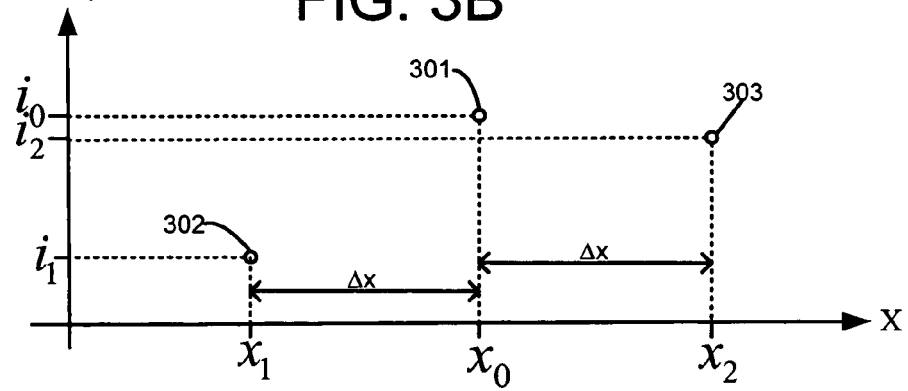
FIG. 3B illustrates, in an intensity graph, the result of performing act 204 of FIG. 2 at the three locations 301-303 shown in FIG. 3A.

Invocation of an aerial image simulator (that performs lithography simulation) with the three locations 301, 302 and 303 yields a corresponding number of intensities $i_0$, $i_1$, and $i_2$ that are shown in FIG. 3B plotted against their distance along the X axis denoted respectively as $x_0$, $x_1$, and $x_2$. Note that $x_0$ is at the center of the portion, and hence equidistant from the two edges at $x_1$, and $x_2$. Note further that all three distances $x_0$, $x_1$, and $x_2$ are of nominal dimensions in the layout feature. Although a number of different curves can be fitted to these three intensities depending on the embodiment, some embodiments fit a very specific curve as shown in FIG. 4, and described next.

Figure 4:
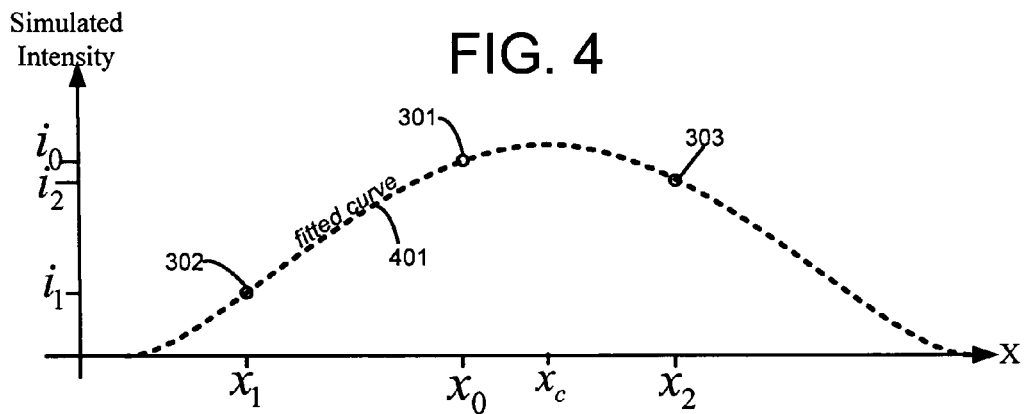
FIGS. 4 and 5 illustrate, in intensity graphs, the respective results of performing acts 205 and 206 of FIG. 2.

Specifically, a curve 401 which is fitted to the three intensities in FIG. 4 is the Normal distribution curve, which is represented by a Gaussian formula for intensity i as follows:

$$i = a\exp\left(-\frac{(x-x_c)^2}{\sigma^2}\right)$$

wherein x denotes distance, $\alpha$ is a constant, $\sigma$ is the standard deviation, and $x_c$ denotes a center of the intensity distribution (i.e. center of the curve). As seen from FIG. 4, the intensity distribution's center $x_c$ does not coincide with the nominal center $x_0$ of the portion when there has been a drift between a nominal shape and its contour obtained from lithography simulation. Such a drift may arise for a number of reasons, e.g. such as the close presence of an adjacent shape, for example rectangle 114n (FIG. 1B).

Some embodiments of the type described herein are programmed to automatically compute the constants $\alpha$, $\sigma$, and $x_c$ by use of the simulated intensities $i_0$, $i_1$, and $i_2$ at the respective locations $x_0$, $x_1$, and $x_2$ based on the following formulae:

$$a = i_0\exp\left(\frac{\left(\ln\frac{i_2}{i_1}\right)^2}{8\ln\left(\frac{i_0^2}{i_1 i_2}\right)}\right), \sigma = w\frac{1}{\sqrt{2\ln\left(\frac{i_0^2}{i_1 i_2}\right)}}, x_c = \frac{w}{4}\frac{\ln\left(\frac{i_2}{i_1}\right)}{\ln\left(\frac{i_0^2}{i_1 i_2}\right)}$$

After these constants are computed, the above-described Gaussian formula for intensity i can be used to interpolate a value for intensity at any location between locations 302 and 303, along the X direction in portion 140.

In some embodiments, a measure (called cd_predictor) is thereafter computed, by use of the above-described Gaussian formula. One choice for computing the cd_predictor is to calculate the width of the Gaussian curve at the height i=T, wherein T is a predetermined threshold, resulting in $$\text{cd\_predictor} = w\sqrt{\frac{\ln\left(\frac{i_0}{T}\right)^2}{\ln\frac{i_0^2}{i_1 i_2}} + \frac{1}{4}\frac{\left(\ln\frac{i_2}{i_1}\right)^2}{\left(\ln\frac{i_0^2}{i_1 i_2}\right)^2}}$$

Specifically, in several of these embodiments, the value for T is selected to be same as a known predetermined value that is normally used in generating contour 113i, of a shape of the feature under evaluation, when using lithography simulation. Next in some embodiments, the distance cd_predictor is identified as the distance across which the Gaussian formula for intensity i yields values greater than threshold T. Three such distances 601, 602 and 603 of the cd_predictor are illustrated for the respective portions 110, 120 and 130 in FIG. 6A.

Note that although a geometric property of the curve fitted to the simulated intensities (such as width at threshold) is used in some embodiments as a cd_predictor, other information from the fitted curve is used as a cd_predictor in other embodiments. For example, some embodiments use a single constant resulting from curve fitting, such as the value of standard deviation $\sigma$ as the cd_predictor, whereas other embodiments use a combination of such constants, such as standard deviation $\sigma$ combined (in some manner which is predetermined, based on experimentation) with the value of constant $\alpha$. One such embodiment uses just the value of a single constant $\alpha$ of the Gaussian curve (after curve-fitting) as the cd_predictor. Yet another embodiment has as its cd_predictor a product of standard deviation $\sigma$ and sqrt([(a/T)−1]) while two other embodiments use the values $\sigma^*$([(a/T)−1]) and $\sigma^2*$([(a/T)−1]) respectively as their cd_predictor.

Figure 7:
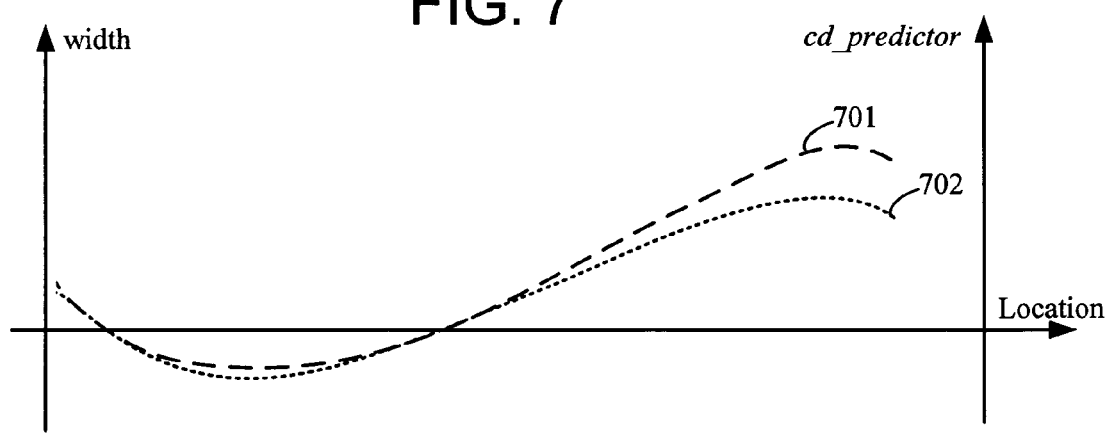
FIGS. 7 and 8 illustrate, in graphs, pairs of curves 701,702 and 801,802 for calculated widths of the printed feature by, e.g., bisection, and cd_predictor values by use of a Gaussian formula as a function of location (plotted on the horizontal axis), in some embodiments of the invention.
Figure 8:
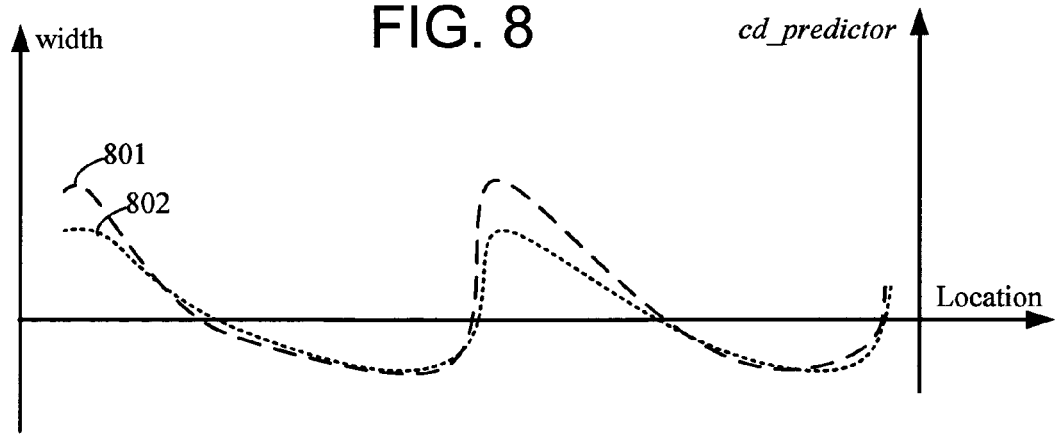

Note that the position and extent of distances 601, 602 and 603 do not coincide with the position and extent of the contour 113i, because distances 601, 602 and 603 are obtained by modeling intensities roughly, to obtain a trend therein, rather than modeling the intensities precisely. FIG. 7 illustrates how predictor values (e.g. cd_predictor distances) obtained from the Gaussian formula as shown by curve 702 track a trend in the corresponding feature widths shown by curve 701 accurately calculated by lithography simulation. A similar graph is shown in FIG. 8. Both graphs in FIGS. 7 and 8 were obtained from use of the Gaussian formula on actual data. FIG. 7 is for features that were oriented vertically while FIG. 8 is for features oriented horizontally. As noted elsewhere herein, Gaussian formula based CD predictor need not yield an accurate value for the feature width itself, because the CD predictor value is not used directly as an approximation of the feature width, and instead is used merely as a trend indicator.

In some embodiments, a local minimum (or local maximum) that occurs within three adjacent portions is determined based on the positions of the three cd_predictor distances 601, 602 and 603. For example, the smallest width in the shape bounded by distances 601 and 603 and the curves 604 and 605 occurs at the position 609 as shown in FIG. 6B. Position 609 is identified in some embodiments by another act of curve fitting, of the three cd_predictor distances 601, 602 and 603 to a quadratic function, followed by finding a local minimum therein, as discussed in detail in Appendix A that is attached hereto.

Note that a smallest cd_predictor distance typically occurs between two cd_predictor distances which have been computed at gauge edges. In the example illustrated in FIG. 6B, the minimum width of the layout feature occurs at i=5.5 which is a fractional location relative to the origin at i–0. To re-state, these embodiments are not limited to finding a minimum width of the feature among integer locations at gauge edges, but go further to locate the feature's minimum width within a gauge, which in the example of FIG. 6B happens to be located between i=5 and i=6.

The just-described process of finding a local minimum's position is repeatedly performed, once for each group of three adjacent portions, followed by locating a global minimum (by finding the local minimum position which has the smallest cd_predictor distance, from among multiple local minima positions). The position of the global minimum is thereafter identified as the location at which the critical dimension (i.e. the smallest width) of the feature occurs.

Some embodiments perform additional acts based on the location of the global minimum to compute the critical dimension itself. For example, certain embodiments compute the critical dimension by performing the above-described bisection process (see Background section above), using the aerial image simulator to perform lithography simulation along a number of points at the location of the global minimum position.

Note that certain embodiments do not compute the critical dimension in some cases when act 209 requires checking if the CD is within specification. Specifically, some embodiments invoke the aerial image simulator at four locations to check for a feature's conformance to CD specification, namely a pair of locations at each end of the cd_predictor distance at the location of the global minimum. Each pair of locations at each end is selected based on a tolerance specified by the user on CD.

For example, if user-specified tolerance is 10% of nominal width w, then the four locations are selected to be the following: Xa+5% w, Xa−5% w, Xb+5% w, Xb−5% w, wherein Xa and Xb are at the two edges of the nominal rectangle, at the location of the global minimum (e.g. at positions 302 and 303 in FIG. 3B if the global minimum were at the center of portion 140). Thereafter, the corresponding intensities I (obtained by invoking the aerial image simulator) are checked relative to threshold T, as follows.

$I(Xa+5\% \ w) > T$ $I(Xa-5\% \ w) < T$ $I(Xb+5\% \ w) < T$ $I(Xb-5\% \ w) > T$

If all four conditions listed above are met, then the CD specification has been met, without computation of the critical dimension itself by the bisection process (i.e. without invoking the aerial image simulator). Hence act 209 (FIG. 2) is optional.

Note that in some embodiments, a feature's conformance to CD specification is not checked as described above and instead, a maximum width and a minimum width of the feature (i.e. the feature's critical dimensions or CDs) are computed as described herein (e.g. in act 209 in FIG. 2, using the gauge method after finding the locations of the CDs), and a difference therebetween (i.e. the difference between the maximum and minimum widths of the feature) is checked against a user-specified limit thereon.

Note that a predetermined formula for tracking the trend of intensities in some embodiments is used only after checking that certain conditions (under which the formula holds) are applicable. For example, a condition that the central intensity $i_0$ is greater than intensities $i_1$, and $i_2$ at the two edges of the feature is checked, e.g. the condition $i_0^2 > i_1 * i_2$ is checked before using the Gaussian formula for intensity i.

In some embodiments, if the just-described condition is not met, the computer automatically performs the above-described bisection process instead of act 206 (FIG. 2) to determine a width of the feature in the current portion and then continues to the next portion via act 207. Accordingly, in the alternative embodiments, a CD location is identified in act 208 (FIG. 2) based on two types of values, one type of values are cd_predictor distances obtained in act 206, and another type are widths of the feature as determined by bisection obtained in an alternative to act 206. Since both types of values are distances, no scaling is performed, and these two types of values are used indistinguishably to identify the critical dimension in act 208 (by using both types of values to determine the local minimum and/or global minimum).

Moreover, some embodiments check if the constant $\alpha$ is greater than the threshold T, and if this condition is not met then an "open" is reported (meaning that the feature will not be formed during fabrication, because all of its intensity is less than threshold). Still other embodiments use the Gaussian formula for intensity i to compute the intensity at nominal center location $x_0$ of the feature, and if this value is less than c*T, then a pinch/bridge is reported on the video monitor, wherein c is a pre-set constant of value, for example, 0.8. The value of constant c is determined by experimentation, and may be changed by the human user of the CD locator.

Note that any CD locator of the type described above (e.g. in reference to FIG. 2) may be used in a digital ASIC design flow, which is illustrated in FIG. 9B in a simplified exemplary representation. At a high level, the process of designing a chip starts with the product idea (900) and is realized in a EDA software design process (910). When the design is finalized, it can be taped-out (event 940). After tape out, fabrication process (950) and packaging and assembly processes (960) occur resulting, ultimately, in finished chips (result 990).

The EDA software design process in two sub-processes (910) and (945) is actually composed of a number of stages 912-926 in the first sub-process and stages 928-930 in the second sub-process which are shown in linear fashion in FIG. 9B for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, and circuitry. Exemplary EDA software products from Synopsys, Inc. that can be used at this stage include the Hercules product. If the layout of the IC design is satisfactory at this stage then a tape out is performed.

Resolution enhancement (stage 928): This involves geometric manipulations of the layout (of the taped out IC design) to improve manufacturability of the design. Exemplary EDA software products from Synopsys, Inc. that can be used at this include Proteus and AFGen products.

Physical Verification (stage 929): Another layout verification operation is performed to ensure that the geometric manipulations performed during stage 928 have not introduced any unintended problems (e.g., mask manufacturing rule violations and layout patterns that could cause lithographic defects). This involves simulation based printing error verification, or lithography rule checking (LRC). Note that verification by LRC in this stage is performed on a post-RET/OPC layout. Exemplary EDA software products from Synopsys, Inc. that can be used at this include SiVL. Note that a CD locator 999 (which performs the acts described above in reference to FIG. 2) can be used during this stage 929, as shown in FIG. 9B. If the displayed results are not satisfactory, a chip designer may go back to stage 928 or to stage 922 to make changes to the IC design as shown in FIG. 9A.

Mask data preparation (stage 930): This provides the "tapeout" data for production of masks for lithographic use to produce finished chips. Exemplary EDA software products from Synopsys, Inc. that can be used at this include the CATS® family of products. Actual circuitry in the real world is created after this stage, in a wafer fabrication facility (also called "fab").

The data structures and software code for implementing one or more acts described in this detailed description can be encoded into a computer-readable storage medium, which may be any storage medium that can hold code and/or data for use by a computer. Storage medium includes, but is not limited to, magnetic and optical storage devices such as disk drives, magnetic tape, CDs (compact discs), and DVDs (digital versatile discs).

Note that a computer system used in some embodiments to implement a CD locator of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Appendix A which is located below, just before the claims, is an integral portion of this detailed description and is incorporated by reference herein in its entirety. Appendix A contains pseudo-code and related information for implementing one illustrative embodiment of a CD locator in accordance with the invention.

Numerous modifications and adaptations of the embodiments described herein will become apparent to the skilled artisan in view of this disclosure.

Figure 5:
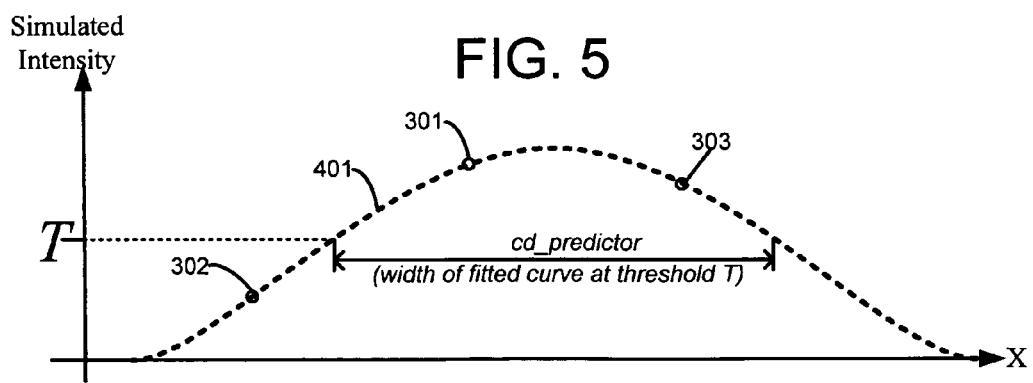

For example, although a normal distribution is illustrated in FIGS. 4 and 5, alternative embodiments use other functions that resemble the shape of the cross-section of intensity of performing lithography to create a printed feature, such as a quadratic function. A piece-wise linear function is used in some embodiments to model the simulated intensity's cross-section (similar to FIGS. 4 and 5) by use of 5 locations as discussed above. Instead of a piece-wise linear function, other embodiments use a piece-wise polynomial function, e.g. using spline(s) to model the simulated intensity's cross-section. Also, the location of a central intensity $i_0$ that is fitted to a Gaussian curve (during modeling of simulated intensity's cross-section) need not be precisely at 50% of nominal width, i.e. an off-center location (e.g. at 45% width) is used in alternative embodiments.

As another example, although a quadratic function is used in some embodiments to find extremes in the cd_predictor values other embodiments use other functions, such as a fourth degree polynomial (to find a minimum and/or a maximum of the cd_predictor value in the longitudinal direction of the feature).

Accordingly, numerous modifications and adaptations of the embodiments described herein are encompassed by the scope of the invention.

APPENDIX A

Figure 6A:
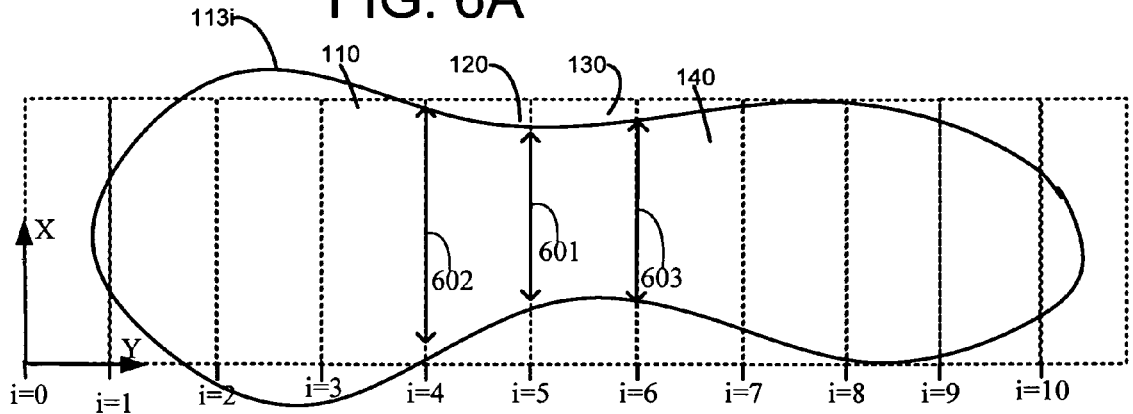
FIG. 6A illustrates three cd_predictor values 601-603 that have been computed as per act 206 for three portions of an IC layout feature, at corresponding Y-axis positions 4, 5 and 6 respectively.
Figure 6B:
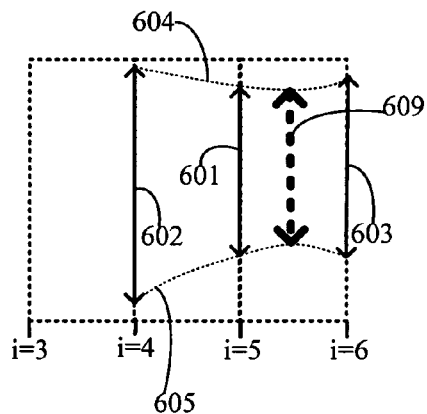
FIG. 6B illustrates a local minimum at Y-axis position 609 in the IC layout feature of FIG. 6A, and its identification based on the three cd_predictor values 601-603 in some embodiments of the invention.
Figure 6C:
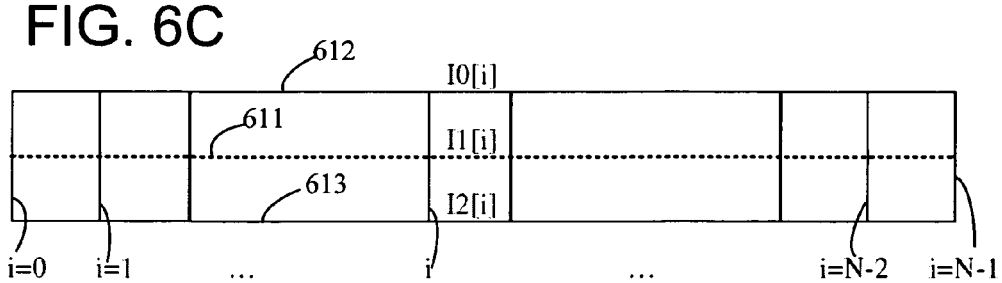
FIG. 6C illustrates a feature in an IC layout with superimposed thereon the positions at which intensities are simulated, for use in constructing a data array of predictor values, in some embodiments of the invention.

Given the sampling scheme and the evaluated intensities on the center-line and the two edges as illustrated in FIG. 6C, a data array {predictor[i]} is constructed as follows (note that each portion of a feature whose CD is being determined is referred to below by an index "i" that is shown in FIGS. 6A-6C as being labeled with values that increase from left to right along the longitudinal direction of the feature, starting with the value 0):

For i=0 to N−1
    predictor[i]=CD_predictor_function(I0[i],I1[i],I2[i]);

The i-th element in the data array {predictor[i]} is a measure of the CD at the sampling location i which denotes a portion of the nominal rectangle. This "measure" need not be an estimate of the CD at that location. It may not even be a length. However, the data array should have the same trend of change as the true CD's {CD[i]}, i.e., {predictor[i]} and {CD[i]} should have the same minima and maxima.

The computer is programmed to find the locations of the minimum and maximum of the data array {predictor[i]}, which is much cheaper to construct than {CD[i]}, and calculate the true CD's at those locations only.

Since the maximal and minimal CD's may occur at locations other than the sampled locations, approximation methods can be used to improve the accuracy of the maximum and minimum locations calculated from {predictor[i]}.

A simple and fast approximation method that is used in a programmed computer of some embodiments of the invention is quadratic approximation, for which pseudo-code is as follows:

---

For any three consecutive sampled locations i−1, i, and i+1
{
    Fit a quadratic function y(x) = ax2 + bx + c using the data points (x[i−1], predictor[i−1]), (x[i], predictor[i]), (x[i+1], predictor[i+1])
If a > 0 and x[i−1] <= −b/2a <= x[i+1]
    y(x) has minimum y(−b/2a) at x = −b/2a
else if a < 0 and x[i−1] <= −b/2a <= x[i+1]
    y(x) has maximum y(−b/2a) at x = −b/2a
}

---

The coefficients a, b, and c are determined by the following formula:

$$a=((predictor[i+1]-predictor[i-1])*z-(predictor[i]-predictor[i-1]))/(z-z*z)$$

$$b=((predictor[i+1]-predictor[i-1])*z*z-(predictor[i]-predictor[i-1]))/(z*z-z)$$

$$c=predictor[i-1]$$

where $$z=(x[i+1]-x[i-1])/(x[i]-x[i-1])$$

In alternative embodiments, determination of the coefficients a, b, and c can be done in several ways. For example, it can be obtained from the Lagrange formula for polynomial interpolation. One can also obtain these coefficients by solving a systems of linear equations formed by plugging in the three points to the quadratic equation. Methods that are used in this manner in alternative embodiments are described in the following book which is incorporated by reference herein in its entirety: "Numerical Recipes in C, The Art of Scientific Computing" by William H. Press, Saul A. Teukolsky, William T. Vetterling, and Brian P. Flannery. Second edition. Cambridge University Press, 1999; for the Lagrange formula, refer to Section 3.1 "Polynomial Interpolation and Extrapolation" on Page 108; and for the system of equation, refer to Section 3.5 "Coefficients of the Interpolating Polynomial" on page 120.

Note that a computer is programmed in many such embodiments to compare all local maxima and minima of {predictor[i]} to get the locations of the global maximum and minimum.

The computer is also programmed in some embodiments to calculate CD's at the global maximum and minimum locations.

Steps of a computer method that is performed in some embodiments are:
1. Collect one dimensional drawn patterns (rectangles) from the pre-OPC layout
2. For each rectangle
    a. Calculate intensities at sampled points on the centerline. If intensities at one or more of the sampled points are less than 0.8*threshold, report total pinch (for line) or bridge (for space) error. Go to the next rectangle
    b. Calculate intensities on edge #1 at the sampled points. If at any point the intensity is greater or equal to the intensity at the corresponding sample point on the centerline, switch to gauge based detection method for this pattern and continue to next pattern. Otherwise, continue with the next step.
    c. Repeat b for edge #2.
    d. Calculate the Gaussian predictor values to identify extreme CD locations. Calculate CDs there and determine whether there are CD errors. Calculate the difference between the two extreme CD values for CD uniformity checking.

What is claimed is:

1. A computer-implemented method to evaluate a layout of an integrated circuit design, the method comprising:
for each position as a current position, in a plurality of positions along a longitudinal direction of a feature in the integrated circuit design:
automatically performing lithography simulation at a plurality of locations in a transverse direction relative to the longitudinal direction, to obtain a corresponding plurality of simulated intensities at said current position,
automatically determining at least one constant at said current position, said constant being comprised in a formula that models the plurality of simulated intensities as a function of distance in the transverse direction at said current position, and
automatically computing a value at said current position, based on at least the formula, the constant, and a known threshold for intensity; and
automatically locating a position of a critical dimension in the feature, based on at least a plurality of values at the plurality of positions, obtained from said computing; and
automatically applying at least one test, based at least on the position of the critical dimension in the feature obtained from said automatically locating;
wherein a result of said automatically applying at least one test is comprised in a memory.

2. The method of claim 1 wherein:
the formula is of a symmetric function.

3. The method of claim 1 wherein:
the formula is of a Gaussian function.

4. The method of claim 1 wherein said value is a distance in the transverse direction across which the formula yields values greater than the known threshold.

5. The method of claim 1 further comprising:
determining a global minimum in the plurality of values.

6. The method of claim 1 further comprising:
determining a global maximum in the plurality of values.

7. The method of claim 1 further comprising,
for said each position as said current position: (a) determining at least one additional constant of an additional formula that models three values, at the current position and at two positions adjacent to the current position, as a function of distance in the longitudinal direction, and (b) using the additional formula to identify a local minimum or a local maximum closest to the current position; and
using said local minimum or local maximum of each position in identifying said position of the critical dimension.

8. The method of claim 7 wherein:
the additional formula is quadratic.

9. A computer-implemented method to locate a critical dimension (CD) in a feature of an integrated circuit (IC) design and evaluate said IC design, the method comprising:
- automatically identifying a plurality of positions along a longitudinal direction of the feature in the IC design;
- for each position in the plurality of positions as a current position:
  - automatically simulating a lithography process at a plurality of locations $x_0$, $x_1$, and $x_2$ at said current position, in a transverse direction relative to the longitudinal direction, to obtain a corresponding plurality of simulated intensities $i_0$, $i_1$, and $i_2$ at said current position, and
  - automatically computing a value for a predictor based on a function for intensity at a known threshold T for intensity, said function comprising said intensities $i_0$, $i_1$, and $i_2$;
- automatically using an extreme value of said predictor among a plurality of values of said predictor at the plurality of positions, to locate a position of the critical dimension (CD) in the feature, along the longitudinal direction;
- automatically applying at least one test, based at least on said position of the critical dimension in the feature obtained from said automatically using; and
- wherein a result of said automatically applying at least one test is comprised in a memory.

10. The method of claim 9 further comprising:
- for each position in a plurality of positions as a current position: (a) automatically determining at least one additional constant of an additional predetermined formula that models three values of said predictor, at the current position and at two positions adjacent to the current position, as a function of distance in the longitudinal direction, and (b) automatically using the additional predetermined formula to identify a local minimum or a local maximum closest to the current position; and
- automatically using said local minimum or local maximum of each position in locating the critical dimension.

11. The method of claim 9 wherein the function comprises:

$$\text{cd\_predictor} = w \sqrt{\frac{\ln\left(\frac{i_0}{T}\right)^2}{\ln\frac{i_0^2}{i_1 i_2}} + \frac{1}{4}\frac{\left(\ln\frac{i_2}{i_1}\right)^2}{\left(\ln\frac{i_0^2}{i_1 i_2}\right)^2}}; \text{ and}$$

wherein w is a nominal width of said feature.

12. The method of claim 9 further comprising,
for said each position as said current position: (a) determining at least one additional constant of an additional formula that models three values, at the current position and at two positions adjacent to the current position, as a function of distance in the longitudinal direction, and (b) using the additional formula to identify a local minimum or a local maximum closest to the current position; and
using said local minimum or local maximum of each position in identifying said position of the critical dimension.

13. An apparatus for locating a critical dimension (CD) in a feature of an integrated circuit (IC) design, the apparatus comprising:
- memory encoded with lithography simulation software and said IC design;
- means, coupled to said memory, for executing the lithography simulation software for each location in a plurality of locations in a transverse direction relative to a longitudinal direction of the feature, to obtain a corresponding plurality of simulated intensities;
- means, coupled to said means for executing, for determining a plurality of constants of a predetermined formula that models the plurality of simulated intensities as a function of distance in the transverse direction; and
- means, coupled to said means for determining, for computing a value based on the predetermined formula, the plurality of constants, and a known threshold for intensity; and
- means, coupled to said means for computing, for identifying a position of the critical dimension in the feature, based on a plurality of values obtained from said means for computing at a plurality of positions along the longitudinal direction; and
- means, coupled to said means for identifying, for applying at least one test, based at least on the position of the critical dimension in the feature;
- wherein said memory comprises a result from said means for applying at least one test.

14. The apparatus of claim 13 wherein:
the predetermined formula is of a Gaussian function.

15. A computer readable storage medium encoded with:
- a first plurality of instructions to automatically simulate a lithography process at a plurality of locations $x_0$, $x_1$, and $x_2$, in a transverse direction relative to a longitudinal direction of a feature in an integrated circuit (IC) design, to obtain a corresponding plurality of simulated intensities $i_0$, $i_1$, and $i_2$;
- a second plurality of instructions to automatically compute a value for a cd_predictor based on a predetermined threshold T for intensity, as follows:

$$\text{cd\_predictor} = w \sqrt{\frac{\ln\left(\frac{i_0}{T}\right)^2}{\ln\frac{i_0^2}{i_1 i_2}} + \frac{1}{4}\frac{\left(\ln\frac{i_2}{i_1}\right)^2}{\left(\ln\frac{i_0^2}{i_1 i_2}\right)^2}}; \text{ and}$$

wherein w is a nominal width of said feature;
- a third plurality of instructions to automatically use a smallest value of cd_predictor in a plurality of values of cd_predictor at a plurality of positions along the longitudinal direction, to identify a position of occurrence of the critical dimension (CD) in the feature along the longitudinal direction; and
- wherein a result of execution of said third plurality of instructions is comprised in a memory.

16. The computer readable storage medium of claim 15 comprising:
an optical disk.

* * * * *

UNITED STATES PATENT AND TRADEMARK OFFICE
CERTIFICATE OF CORRECTION

PATENT NO.        : 7,636,904 B2                                    Page 1 of 1
APPLICATION NO.   : 11/584356
DATED             : December 22, 2009
INVENTOR(S)       : Song et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 424 days.

Signed and Sealed this

Ninth Day of November, 2010

David J. Kappos
*Director of the United States Patent and Trademark Office*